(12) United States Patent
Bogue et al.

(10) Patent No.: US 9,368,950 B2
(45) Date of Patent: Jun. 14, 2016

(54) EXTERNAL MOUNTING OF ELECTRONIC OR ELECTRICAL DEVICES WITH SEALED INTERNAL WIRING

(76) Inventors: Charisma Bogue, Zelienople, PA (US); Michael Panson, Pittsburgh, PA (US)

( * ) Notice: Subject to any disclaimer, the term of this patent is extended or adjusted under 35 U.S.C. 154(b) by 605 days.

(21) Appl. No.: 13/590,236

(22) Filed: Aug. 21, 2012

(65) Prior Publication Data

US 2014/0057499 A1     Feb. 27, 2014

(51) Int. Cl.
| | |
|---|---|
| *H01B 17/26* | (2006.01) |
| *H01R 13/207* | (2006.01) |
| *H02G 3/22* | (2006.01) |
| *H05K 9/00* | (2006.01) |
| *H02G 3/06* | (2006.01) |
| *H02G 3/08* | (2006.01) |

(52) U.S. Cl.
CPC ............... *H02G 3/22* (2013.01); *H02G 3/0675* (2013.01); *H02G 3/088* (2013.01); *H05K 9/0018* (2013.01)

(58) Field of Classification Search
CPC ....... H02G 3/22; H02G 3/088; H02G 3/0683; H02G 3/0675; F16L 59/135; H05K 5/00; H05K 5/502; H01R 13/207; H01R 9/00; H01R 9/03; H01R 9/24; H01R 13/00
USPC ............. 174/155, 650, 50, 520, 559, 60, 653, 174/656, 651, 665, 482, 655, 652, 151; 439/76.1, 76.2, 721, 662; 361/600, 361/601, 679.01, 728, 730, 796; 248/68.1, 248/49
See application file for complete search history.

(56) References Cited

U.S. PATENT DOCUMENTS

| | | | | | |
|---|---|---|---|---|---|
| 1,650,233 | A | * | 11/1927 | Plunkett | 220/3.94 |
| 3,500,253 | A | * | 3/1970 | Oprysko | 333/126 |
| 3,617,811 | A | * | 11/1971 | McVoy | 439/76.1 |
| 4,525,021 | A | * | 6/1985 | Williams | 439/451 |
| 4,731,501 | A | * | 3/1988 | Clark et al. | 174/669 |
| 4,778,949 | A | * | 10/1988 | Esterle et al. | 174/151 |
| 4,837,655 | A | * | 6/1989 | Ekowicki | 361/103 |
| 5,147,979 | A | * | 9/1992 | Yang | 174/482 |
| 5,382,752 | A | * | 1/1995 | Reyhan et al. | 174/50 |
| 5,920,035 | A | * | 7/1999 | Haney et al. | 174/652 |
| 6,180,882 | B1 | * | 1/2001 | Dinh | 174/655 |
| 6,268,565 | B1 | * | 7/2001 | Daoud | 174/657 |
| 6,323,433 | B1 | * | 11/2001 | Mahaney et al. | 174/650 |
| 6,527,302 | B1 | * | 3/2003 | Gault et al. | 174/50 |
| 6,639,149 | B1 | * | 10/2003 | Wu | 174/50 |
| 6,695,643 | B2 | * | 2/2004 | Wu | 439/545 |
| 6,733,345 | B2 | * | 5/2004 | Weise et al. | 439/721 |
| 2010/0307816 | A1 | * | 12/2010 | Hurrell et al. | 174/650 |

* cited by examiner

*Primary Examiner* — Angel L Estrada
(74) *Attorney, Agent, or Firm* — James Ray and Assocs

(57) ABSTRACT

A connection includes one or more hollow tubular members extending outwardly from an exterior surface of a first member, a first thread provided on an exterior surface of the one or more hollow tubular members, one or more apertures formed through a thickness of a second member and sized to receive therethrough the one or more hollow tubular members, and one or more third members having a second thread sized to operatively engage the first thread, whereby the second member is securely connected to the first member.

19 Claims, 3 Drawing Sheets

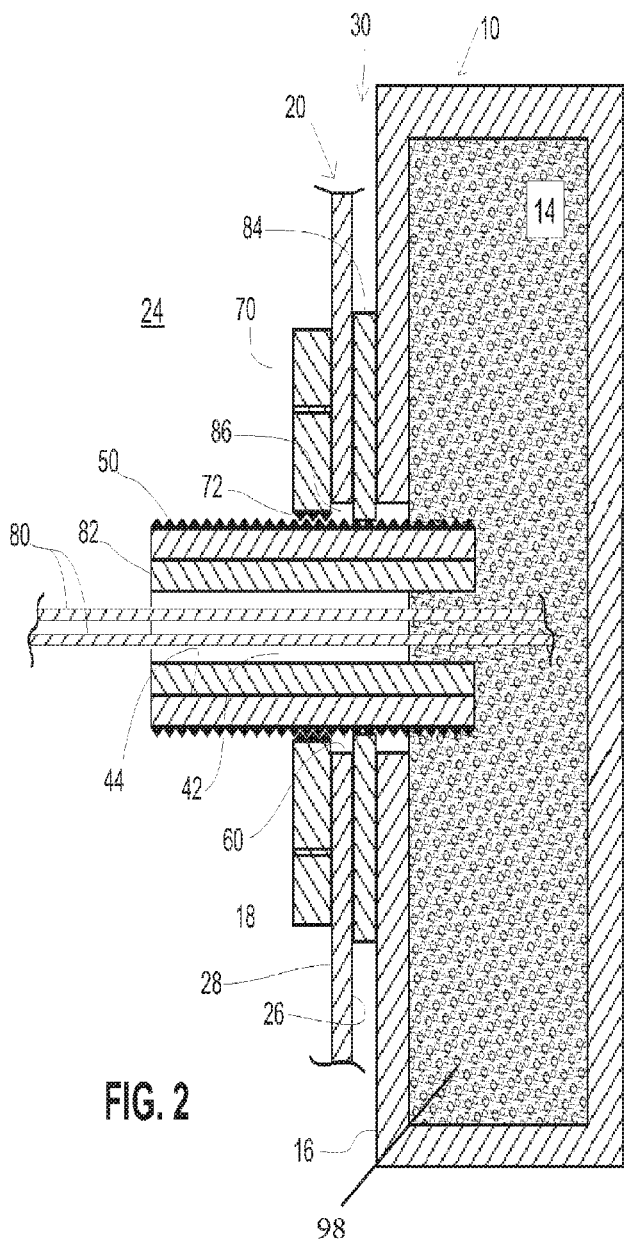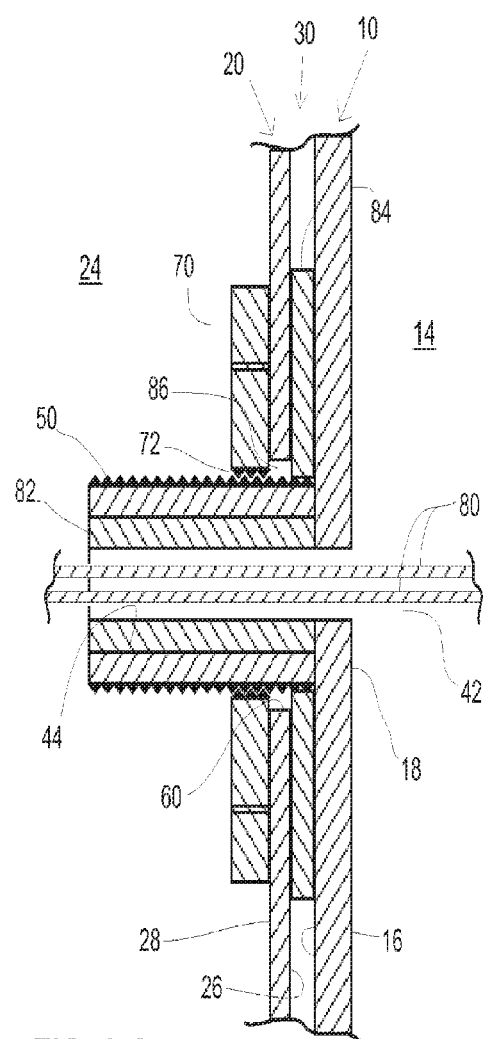

EXTERNAL MOUNTING OF ELECTRONIC OR ELECTRICAL DEVICES WITH SEALED INTERNAL WIRING

FIELD OF THE INVENTION

The present invention relates, in general, to mounting of electronic or electrical devices and, more particularly, this invention relates to a method and arrangement for electrically and mechanically mounting electronic or electrical devices in a manner that provides a sealed internal wiring connection.

STATEMENT REGARDING FEDERALLY SPONSORED RESEARCH AND DEVELOPMENT

N/A

REFERENCE TO SEQUENCE LISTING, A TABLE, OR A COMPUTER PROGRAM LISTING COMPACT DISC APPENDIX

N/A

BACKGROUND OF THE INVENTION

Conventionally, electrical connection between two electrically operated devices is disposed external to surface of at least one of such two electrically operated devices. Accordingly, greater than desired effort and costs are required during installation in order to protect such electrical connection with extra conduits and fittings from environmental factors and tampering. Furthermore, the external connection, visible to many, may be disadvantaged in some applications.

Therefore, there is a need for an improved electrical connection between two electrically operated devices that is hidden from direct view and reduces installation costs.

SUMMARY OF THE INVENTION

The invention provides a connection that includes one or more hollow tubular members extending outwardly from an exterior surface of a first member, a first thread provided on an exterior surface of the one or more hollow tubular members, one or more apertures formed through a thickness of a second member and sized to receive therethrough the one or more hollow tubular members, and one or more third members having a second thread sized to operatively engage the first thread, whereby the second member is securely connected to the first member.

The invention also provides a connection that includes a first electrically operable member having a first enclosure with an exterior surface and a generally hollow interior and a second electrically operable member having a second enclosure with an exterior surface and a generally hollow interior, wherein a portion of the exterior surface of the first member is disposed in a generally direct contact with a portion of the exterior surface of the second member. Two hollow tubular members are disposed in a spaced apart relationship with each other and extending outwardly from the portion of the exterior surface of one of the first and second members. Two apertures are formed through a wall thickness of the one of the first and second members, whereby each hollow tubular member is disposed in open communication with the generally hollow interior of the one of the first and second members. A thread is provided on an exterior surface of the each of the pair of hollow tubular members. There is a pair of apertures, each formed through a wall thickness of an opposite one of the first and second members and sized to receive therethrough the pair of hollow tubular member. There is also a pair of third members, each having a thread formed through thickness thereof and configured to operatively mate with the thread of the each of the pair of hollow tubular members, whereby the first member is securely connected to the second member. At least one electrical wire passed through the at least one of the pair of hollow tubular members.

The invention also provides a method of for electrically and mechanically mounting electronic or electrical devices in a manner that provides a sealed internal wiring connection.

OBJECTS OF THE INVENTION

It is, therefore, one of the primary objects of the present invention to provide an electrical and mechanical connection between two electrically operated devices.

Another object of the present invention is to provide electrical and mechanical connection between two electrically operated devices that is hidden from direct view.

Yet another object of the present invention is to provide electrical and mechanical connection between two electrically operated devices that is protected from environmental factors.

A further object of the present invention is to provide electrical and mechanical connection between two electrically operated devices that reduces installation costs.

Yet a further object of the present invention is to provide electrical and mechanical connection between two electrically operated devices that shields the wiring from unwanted radio or electromagnetic emissions.

An additional object of the present invention is to provide a method of electrically and mechanically connecting two electrically operated devices or electrically and mechanically connecting one electrically operated device to a dwelling or other structure.

In addition to the several objects and advantages of the present invention which have been described with some degree of specificity above, various other objects and advantages of the invention will become more readily apparent to those persons who are skilled in the relevant art, particularly, when such description is taken in conjunction with the attached drawing Figures and with the appended claims.

BRIEF DESCRIPTION OF THE DRAWINGS

FIGS. 2-2a depict two forms of one partial cross-sectional view of the arrangement of FIG. 1;

BRIEF DESCRIPTION OF THE VARIOUS EMBODIMENTS OF THE INVENTION

Figure 1:
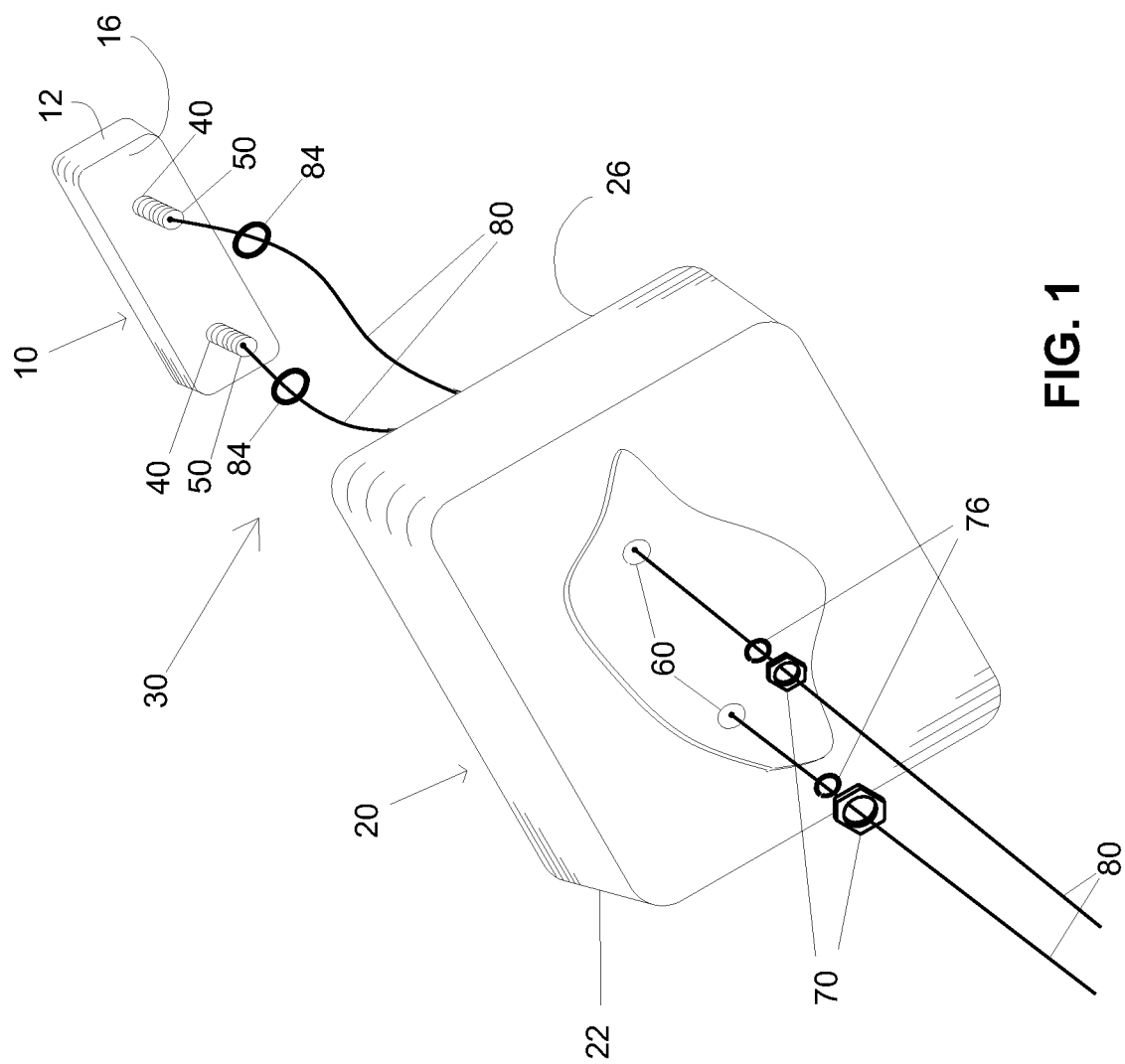
FIG. 1 is a perspective view of an arrangement for mounting electrical or electronic devices.

Prior to proceeding to the more detailed description of the present invention, it should be noted that, for the sake of clarity and understanding, identical components which have identical functions have been identified with identical reference numerals throughout the several views illustrated in the drawing figures.

The present invention describes a connection and method for mounting and electrically connecting at least one electrically operable device in a manner that provides a sealed internal wiring connection hidden from direct view and protected from environmental factors.

Reference is now made, to FIGS. 1-4, wherein there is shown a connection, generally designated as 30, for connecting a first member 10 to a second member 20. The first member 10 includes an enclosure 12 having a generally hollow interior compartment 14 and an exterior surface 16. The second member 20 also includes an enclosure 22 having a generally hollow interior compartment 24 and an exterior surface 26.

In accordance with one form of the invention, the connection 30 includes one or more hollow tubular members 40 extending outwardly from an exterior surface 16 of the first member 10. One or more hollow tubular members 40 are disposed within peripheral confines of a surface portion area of the first member 10. A first thread 50 is provided on an exterior surface of each hollow tubular member 40. One or more apertures 60 are formed through a wall thickness of the second member 20 and are sized to receive therethrough the respective hollow tubular member 40. There are also one or more third members 70 having a second thread 72 sized to operatively engage the first thread 50, whereby the second member 20 is securely connected to the first member 10, whereby a portion of the exterior surface 16 one the first member 10 generally directly contacts a portion of the exterior surface 26 one the second member 20. By way of an example of FIG. 1 only, the one or more hollow tubular members 40 is a pair of hollow tubular members 40 disposed in a spaced apart relationship with each other and wherein one or more apertures 60 is a pair of apertures 60 operatively aligned with the pair of hollow tubular members 40. Furthermore, the hollow interiors 42 of the pair of hollow tubular members 40 are disposed in open communication with the generally hollow interior compartment 14 of the enclosure 12 and are further disposed in open communication with the generally hollow interior compartment 24 of the enclosure 22. The third members 70 are fasteners and, more specifically are nut fasteners. Optional washers 75 may be also provided in a conventional manner Preferably the first member 10 and the second member 20 are electrically operable and the connection 30 further includes one or more electrical wires 80 passed through a hollow interior 42 of at least one hollow tubular member 40, wherein the cross-sectional area of such hollow interior 42 is preferably sized larger than cross-sectional area occupied by the wires 80, although other cross-sectional relationships are also contemplated by the instant invention. The connection 30 may also include optional shield member 82 encasing and configured to either shield electrical wires 80 from external electromagnetic radiation emissions or shield the external environment form the electromagnetic radiation emitted by the electrical wires 80. By way of one example only of FIG. 2, the shield member 82 is provided as a tubular member and is preferably secured, for example by way of adhesives (not shown) to the interior surface 44 of each hollow tubular member 40.

The connection 30 of FIGS. 1-4 is further configured to include a pair of compressible members or gaskets 84 disposed between the contacting exterior surface portions of the first and second members 10 and 20, each of the pair of compressible members 84 having an aperture 86 formed through a thickness thereof and sized so as to pass the hollow tubular member 40 therethrough. It would be understood that the gaskets 84 compress during connection so that aligned and cooperating portions of the exterior surfaces 16 and 26 are in direct abutting contact with each other.

In accordance with another form of the invention, the connection 30 includes at least one hollow tubular member 40 extending outwardly from an exterior surface 16 of a first member 10. At least one aperture 60 is formed through a thickness of a second member 20 and is sized to receive therethrough the at least one hollow tubular member 40. There is also means for securely connecting the first and second members, 10 and 20 respectively, therebetween. Such securing means may include the above described first thread 50 provided on an exterior surface of the at least one hollow tubular member 40 and at least one threaded fastener 70 disposed in threaded engagement with the first thread 50.

Figure 3:
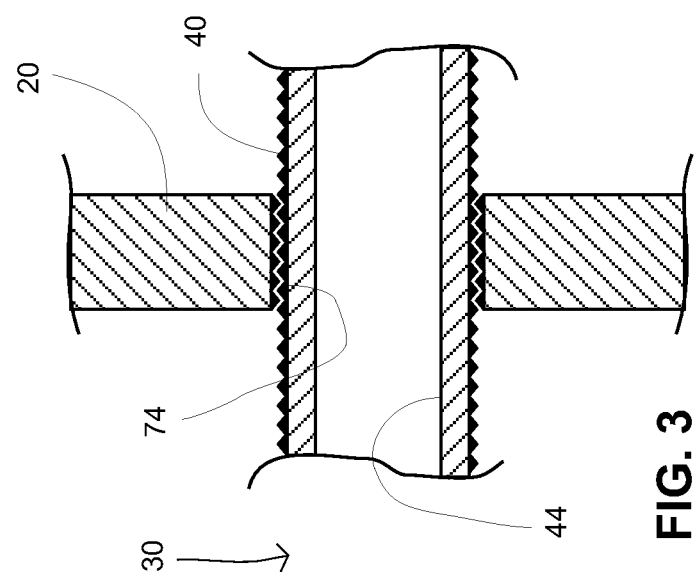
FIG. 3 is another partial cross-sectional view of the arrangement of FIG. 1.

Now in further reference to FIG. 3, such securing means may also include a first thread 50 provided on an exterior surface of the at least one hollow tubular member 40, a second thread 74 disposed on an interior surface of the aperture 60 and a threaded engagement between the first and second threads, 50 and 74 respectively.

Figure 4:
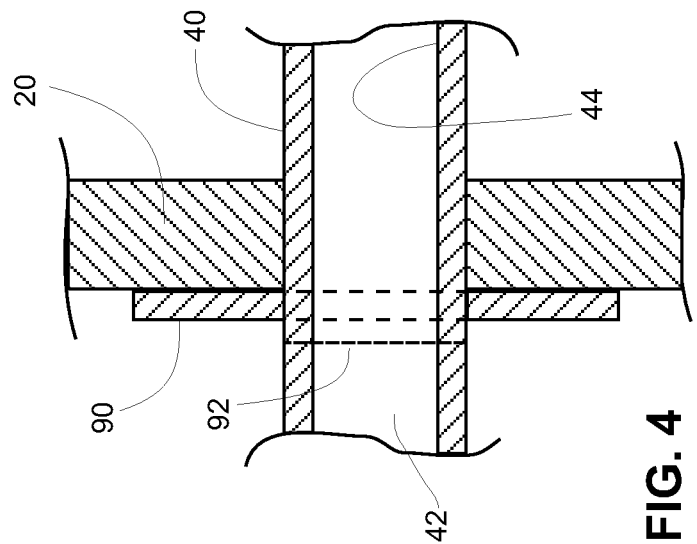
FIG. 4 is a further partial cross-sectional view of the arrangement of FIG. 1.

In further reference to FIG. 4, such securing means may also include a fastener 90 mating with an end of the at least one hollow tubular member 40 extending past a surface 28 being opposite to the surface 26 of the second member 20. More specifically, such fastener 90 may be a conventional retaining clip with the at least one hollow tubular member 40 including a groove 92 disposed on an exterior surface thereof and wherein the fastener the clip 90 is sized and shaped to mate with the groove 92.

The connection 30 further includes at least one gasket 84 disposed between oppositely disposed portions of the exterior surfaces 16 and 26 of the first and second members, 10 and 20 respectively.

In yet another form of the invention, the connection 30 includes a first electrically operable member 10 having a first enclosure 12 with a generally hollow interior compartment 14 and an exterior surface 16. There is a second electrically operable member 20 having a second enclosure 22 with an exterior surface 26 and a generally hollow interior compartment 24, wherein a portion of the exterior surface 16 of the first member 10 is disposed in a generally direct contact with a portion of the exterior surface 26 of the second member 20. Pair of hollow tubular members 40 are disposed in a spaced apart relationship with each other and extend outwardly from the portion of the exterior surface of one of the first and second members, shown as the first member 10 in FIGS. 1-4. Two apertures 18 are formed through the wall thickness of one of the first and second members, shown as the first member 10 in FIGS. 2-2a, so that each hollow tubular member 40 is disposed in open communication with the generally hollow interior compartment of the one of the first member 10. A thread 50 is provided on an exterior surface of the each of the pair of hollow tubular members 40. A pair of apertures 60 are formed through a wall thickness of an opposite one of the first and second members, shown as the second member 20, and sized to receive therethrough the pair of hollow tubular member 40. A pair of third members 70 are provided, each having a thread 72 formed through thickness thereof and configured to operatively mate with the thread 50 of the each of the pair of hollow tubular members 40, whereby the first member 10 is securely connected to the second member 20. At least one electrical wire 80 is passed through at least one of the pair of hollow tubular members 40. The connection 30 further includes a pair of compressible members or gaskets 84 disposed between the contacting exterior surface portions of the first and second members, 10 and 20 respectively, each of the pair of compressible members 84 having an aperture 86 formed through a thickness thereof and sized so as to pass the hollow tubular member 40 therethrough. The connection 30 further includes a pair of shield members 82, each of the pair of shield members attached to an interior surface 44 of a respective one of the pair of hollow tubular members 40.

A method of connecting a pair of electrically operable devices 10 and 20, each having an enclosure with an exterior surface and a generally hollow interior compartment, includes the step of positioning a pair of hollow tubular members 40 in a spaced apart relationship with each other. Then, forming a thread 50 on an exterior surface of the each of the pair of hollow tubular members 40. Next, disposing each hollow tubular members 40 in open communication with the generally hollow interior of the one of the first and second members, 10 and 20 respectively, by way of apertures formed through the wall thickness. Extending the pair of hollow tubular members 40 outwardly from a portion of the exterior surface of one of the first and second members, 10 and 20 respectively. Then, forming a pair of apertures 60 through a wall thickness of an opposite one of the first and second members, 10 and 20 respectively. Next, extending the pair of hollow tubular member 40 through the apertures 60 into the generally hollow interior compartment of an opposite one of the first and second members, 10 and 20 respectively. Then, engaging a threaded fastener 70 onto an end of each hollow tubular member 40 extending into the generally hollow interior compartment of the opposite one of the first and second members, 10 and 20 respectively. Finally, advancing each threaded fastener 70 for a positive contact with an interior surface of the opposite one of the first and second members, 10 and 20 respectively, shown as the surface 28 in FIGS. 2-2*a*.

The above described connection and method advantageously protect the electrical wiring connection from environmental conditions (moisture, dust, dirt, corrosive elements, sun, wind and the like) as well as provide protection from undesirable electromagnetic radiation emissions.

The above described connection and method further advantageously reduce the cost of the connection between a pair of electrically operable devices by eliminating need for separate apertures or passages as related to mechanical and electrical connections, including conduits, in a conventional external connection of a pair of devices Equally as important, the above described connection and method provide cosmetically appealing electrical connection between a pair of members by shielding passage of the at least one electrical wire 80 from direct view.

Furthermore, absence of exposed external wiring connection(s) at least substantially reduces vandalism instances and inadvertent abuse wherein wires that are not hanging out in view will not get caught-up for as users of equipment while in their daily course of work/production will have reduced downtime because of less potential to fail if the wires are hidden from view and exposure and thereby experience greater productivity.

Although the present invention has been shown in terms of both members 10 and 20 being electrically operable, it will be apparent to those skilled in the art, that the present invention may be applied to other combinations. For example, a first member may be an electrically operable device, for example such as a dynamic braking resistor or a radio receiver, while the second member 20 may be a conventional dwelling structure. One dynamic brake resistor design manufactured by Akostar, Inc of Zelienople, Pa. takes advantage of imbedding one end of the tubular member 40 into the material 98, as best shown in FIG. 2, thus creating a unique mounting method of the tubular member(s) 40. Presently preferred material 98 is a cement although any other sand based materials or pitting type compounds are contemplated by the instant invention.

Furthermore, other mountings, for example such as gluing, welding, bolting and the like are also contemplated in the instant invention.

Thus, the present invention has been described in such full, clear, concise and exact terms as to enable any person skilled in the art to which it pertains to make and use the same. It will be understood that variations, modifications, equivalents and substitutions for components of the specifically described embodiments of the invention may be made by those skilled in the art without departing from the spirit and scope of the invention as set forth in the appended claims.

We claim:

1. A mechanical and an electrical connections between an electronically operable device and a member, comprising:
    one or more hollow tubular members extending outwardly from an exterior surface of said electronically operable device;
    a first thread provided on an exterior surface of said one or more hollow tubular members;
    one or more apertures formed through a thickness of said member and sized to receive therethrough said one or more hollow tubular members;
    one or more threaded members abutting, during use, an interior surface of said member and having a second thread sized to operatively engage said first thread;
    an operative engagement between said first and second threads providing the mechanical connection between said electronically operable device and said member with a portion of said exterior surface of said electronically operable device being in a generally direct contact with a portion of an exterior surface of said member; and
    wires from said electronically operable device passed through said one or more hollow tubular members into an interior of said member for the electrical connection therewithin.

2. The connection of claim 1, further including one more electrical wires passed through a hollow interior of said one or more hollow tubular members.

3. The connection of claim 1, wherein said one or more hollow tubular members are disposed within peripheral confines of said exterior surface of said member.

4. The connection of claim 1, wherein said one or more hollow tubular members is a pair of hollow tubular members disposed in a spaced apart relationship with each other and wherein said one or more apertures is a pair of apertures operatively aligned with said pair of hollow tubular members.

5. The mechanical and an electrical connection of claim 1, wherein said one or more hollow tubular members further extend into a hollow interior of the electronically operable device.

6. The mechanical and electrical connections of claim 1, further comprising a shield member secured to an interior surface of said one or more hollow tubular members.

7. The mechanical and electrical connections of claim 1, further comprising a threaded engagement between said one or more hollow tubular members and said electronically operable device.

8. The mechanical and electrical connections of claim 1, wherein said electronically operable device includes one or more apertures through a wall thickness thereof, a material disposed within a hollow interior of said electronically operable device and exterior surface of said one or more hollow tubular members being passed through said one or more apertures so that said one or more hollow tubular members being imbedded into said material.

9. A connection comprising:
(a) at least one hollow tubular member extending outwardly from an exterior surface of a first member;
(b) at least one aperture formed through a thickness of a second member and sized to receive therethrough said at least one hollow tubular member; and
(c) means for securely connecting the first and second members therebetween, comprising a first thread provided on an exterior surface of said at least one hollow tubular member, a second thread disposed on an interior surface of said aperture, and a threaded engagement between said first and second threads.

10. The connection of claim 9, wherein said connection includes the first and second members and wherein each of the first and second members is an electrically operable device.

11. The connection of claim 10, wherein said first member includes an enclosure carrying said exterior surface thereof and wherein said at least one hollow tubular member is disposed in an open communication with an interior compartment of said enclosure.

12. The connection of claim 9, further including at least one electrical wire passed through said at least one tubular member and wherein said connection is configured to shield passage of said at least one electrical wire from direct view.

13. The connection of claim 9, further including at least one electrical wire passed through said at least one hollow tubular member and at least one shield member encasing said at least one electrical wire.

14. The connection of claim 13, wherein at least shield member is attached to an interior surface of said at least one hollow tubular member.

15. The connection of claim 9, further including at least one gasket disposed between oppositely disposed surfaces of the first and second members.

16. A mechanical and an electrical connection comprising:
(a) a first electrically operable member having a first enclosure with an exterior surface and a generally hollow interior;
(b) a second electrically operable member having a second enclosure with an exterior surface and a generally hollow interior;
(c) a pair of hollow tubular members disposed in a spaced apart relationship with each other and extending outwardly from said portion of said exterior surface of one of said first and second members, wherein each hollow tubular member is disposed in open communication with said generally hollow interior of said one of said first and second members;
(d) a thread provided on an exterior surface of said each of said pair of hollow tubular members;
(e) a pair of apertures formed through a wall thickness of an opposite one of said first and second members and sized to receive therethrough said pair of hollow tubular member;
(f) a pair of third members each having a thread formed through thickness thereof and configured to operatively mate with said thread of said each of said pair of hollow tubular members, whereby said first member is securely connected to said second member, providing said mechanical connection between said first and second members wherein a portion of said exterior surface of said first member is disposed in a generally direct contact with a portion of said exterior surface of said second member; and
(g) at least one electrical wire passed through at least one of said pair of hollow tubular members from a follow interior of said one of said first and second electrically operable members into a hollow interior of another one of said first and second electrically operable members for said electrical connection therewithin.

17. The connection of claim 16, further including a pair of compressible members disposed between said contacting surface portions of said first and second members, each of said pair of compressible members having an aperture formed through a thickness thereof and sized so as to pass said hollow tubular member therethrough.

18. The connection of claim 16, further including a pair of shield members, each of said pair of shield members attached to an interior surface of a respective one of said pair of hollow tubular members.

19. A method of mechanically and electrically connecting a pair of electrically operable devices each having an enclosure with an exterior surface and a generally hollow interior compartment, said method comprising:
(a) positioning a pair of hollow tubular members in a spaced apart relationship with each other;
(b) providing a thread on an exterior surface of said each of said pair of hollow tubular members;
(c) disposing each hollow tubular member in open communication with said generally hollow interior of said one of said first and second electrically operable devices;
(d) forming a pair of apertures through a wall thickness of an opposite one of said first and second electrically operable devices;
(e) extending said pair of hollow tubular members outwardly from a portion of said exterior surface of one of said first and second electrically operable devices;
(f) extending said pair of hollow tubular member through said apertures into said generally hollow interior compartment of an opposite one of said first and second electrically operable devices;
(g) engaging a threaded fastener onto an end of each hollow tubular member extending into said generally hollow interior compartment of said opposite one of said first and second electrically operable devices;
(h) advancing each threaded fastener for a generally positive contact with an interior surface of said opposite one of said first and second electrically operable devices and providing said mechanical connection between said first and second electrically operable devices, wherein a portion of said exterior surface of said one of said first and second electrically operable devices is disposed in a generally direct contact with a portion of an exterior surface of said opposite one of said one of said first and second electrically operable devices; and
(i) passing wires from said one of said first and second electrically operable devices through said pair of hollow tubular members into a hollow interior of said opposite one of said one of said first and second electrically operable devices for said electrical connection therebetween.

* * * * *